(12) United States Patent
Takaki et al.

(10) Patent No.: US 10,115,895 B1
(45) Date of Patent: Oct. 30, 2018

(54) VERTICAL FIELD EFFECT TRANSISITORS HAVING A RECTANGULAR SURROUND GATE AND METHOD OF MAKING THE SAME

(71) Applicant: SANDISK TECHNOLOGIES LLC, Plano, TX (US)

(72) Inventors: Seje Takaki, Yokkaichi (JP); Jongsun Sel, Los Gatos, CA (US); Hisakazu Otoi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/715,532

(22) Filed: Sep. 26, 2017

(51) Int. Cl.
*H01L 29/06* (2006.01)
*H01L 47/00* (2006.01)
*H01L 45/00* (2006.01)
*H01L 27/24* (2006.01)
*H01L 27/105* (2006.01)

(52) U.S. Cl.
CPC ...... *H01L 45/1206* (2013.01); *H01L 27/1052* (2013.01); *H01L 27/249* (2013.01); *H01L 27/2454* (2013.01); *H01L 45/16* (2013.01)

(58) Field of Classification Search
CPC .................. H01L 45/1206; H01L 27/1052
USPC .............................................. 257/5; 438/268
See application file for complete search history.

(56) References Cited

U.S. PATENT DOCUMENTS

| | | | |
|---|---|---|---|
| 5,382,816 A * | 1/1995 | Mitsui | H01L 27/10841 257/265 |
| 5,915,167 A | 6/1999 | Leedy | |
| 7,701,746 B2 | 4/2010 | Meeks et al. | |
| 7,764,534 B2 | 7/2010 | Thorp et al. | |
| 9,331,088 B2 | 5/2016 | Takaki | |
| 9,343,507 B2 | 5/2016 | Takaki | |
| 9,437,658 B2 | 9/2016 | Sakotsubo | |
| 9,583,615 B2 | 2/2017 | Chen et al. | |

(Continued)

FOREIGN PATENT DOCUMENTS

WO    WO 2007/004843 A1    1/2007

OTHER PUBLICATIONS

U.S. Appl. No. 15/400,244, filed Jan. 6, 2017, SanDisk Technologies LLC.

(Continued)

*Primary Examiner* — Igwe U Anya
(74) *Attorney, Agent, or Firm* — The Marbury Law Group PLLC

(57) ABSTRACT

Dielectric wall structures are formed through a stack of a doped semiconductor material layer, a planar insulating spacer layer, and a sacrificial matrix layer. Gate electrode rails are formed through the dielectric wall structures and the sacrificial matrix layer. A two-dimensional array of rectangular openings is formed by removing remaining portions of the sacrificial matrix layer. A two-dimensional array of tubular gate electrode portions is formed in the two-dimensional array of rectangular openings. Gate dielectrics are formed on sidewalls of the tubular gate electrode portions. Vertical semiconductor channels are formed within each of the gate dielectrics by deposition of a semiconductor material. A two-dimensional array of vertical field effect transistors including surround gates is formed, which may be employed as access transistors of a three-dimensional memory device.

20 Claims, 18 Drawing Sheets

(56) References Cited

U.S. PATENT DOCUMENTS

| | | | |
|---|---|---|---|
| 2006/0017104 A1* | 1/2006 | Yoon | H01L 29/66666 257/346 |
| 2011/0012085 A1* | 1/2011 | Deligianni | B82Y 10/00 257/9 |
| 2013/0043455 A1 | 2/2013 | Bateman | |
| 2014/0370675 A1* | 12/2014 | Lee | H01L 29/792 438/268 |
| 2017/0141161 A1 | 5/2017 | Sakotsubo | |

OTHER PUBLICATIONS

U.S. Appl. No. 15/632,773, filed Jun. 26, 2017, SanDisk Technologies LLC.
U.S. Appl. No. 15/633,092, filed Jun. 26, 2017, SanDisk Technologies LLC.
U.S. Appl. No. 15/672,929, filed Aug. 9, 2017, SanDisk Technologies LLC.
U.S. Appl. No. 15/711,075, filed Sep. 21, 2017, SanDisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

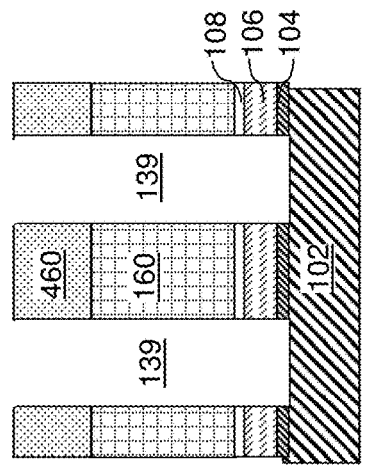
FIG. 3A
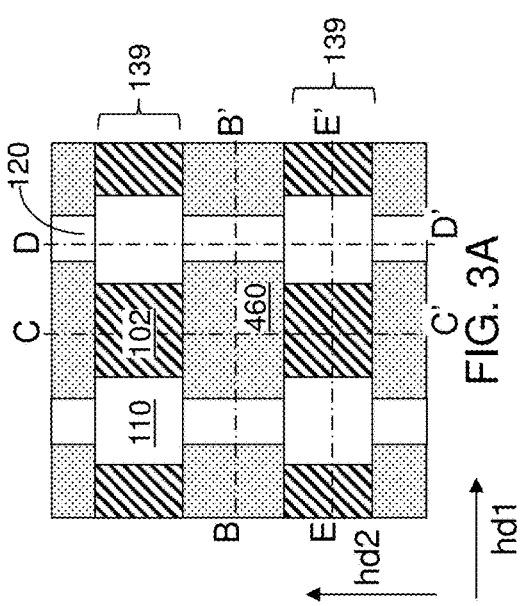
FIG. 3B
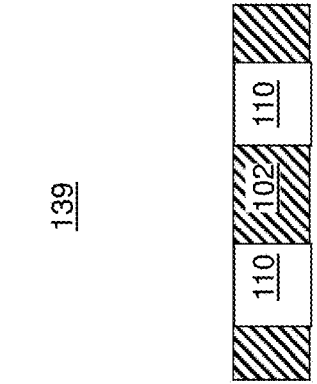
FIG. 3C
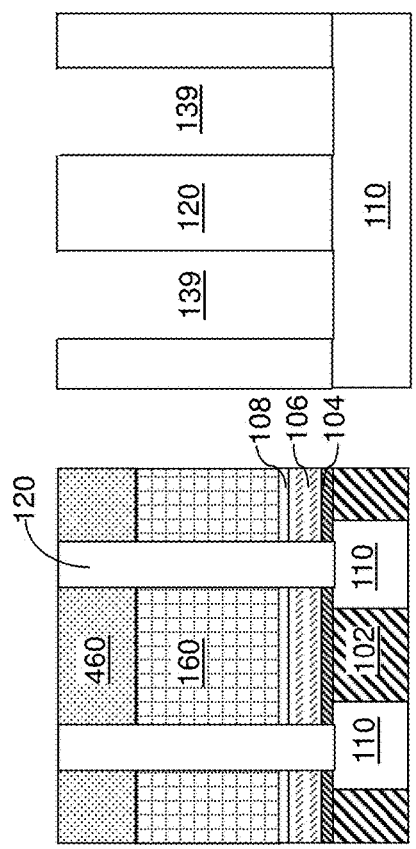
FIG. 3D
FIG. 3E

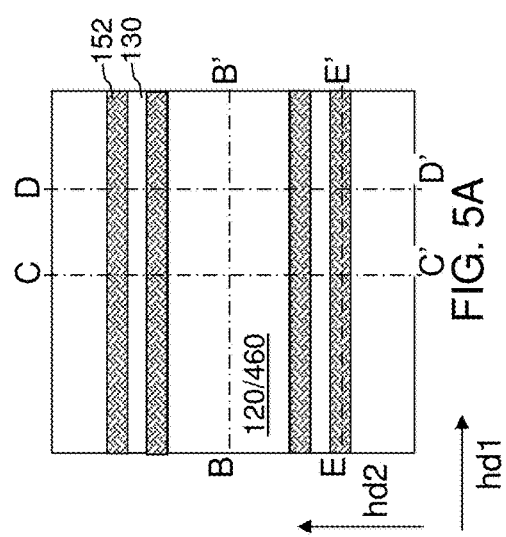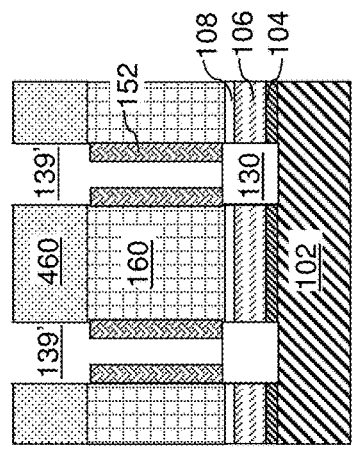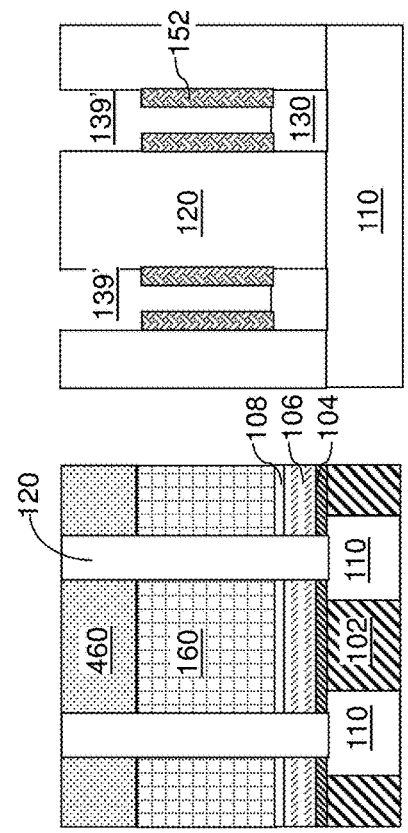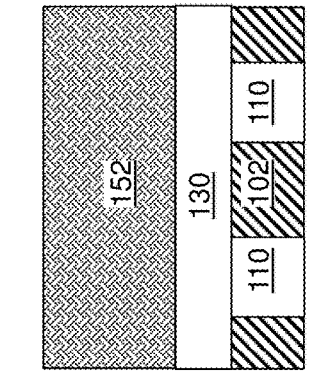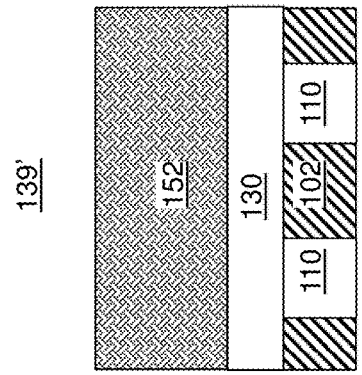

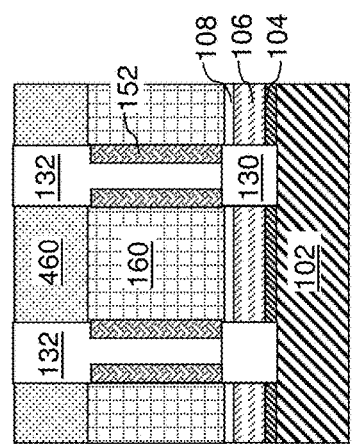
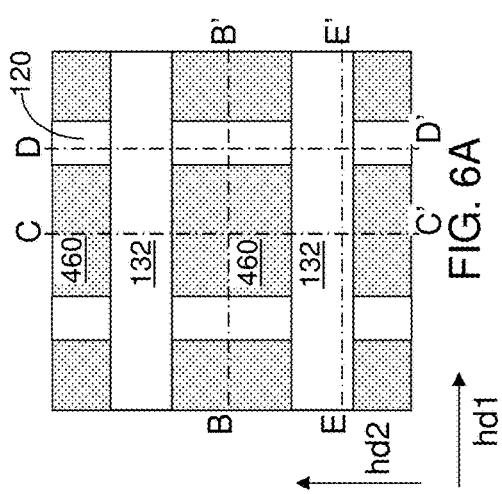
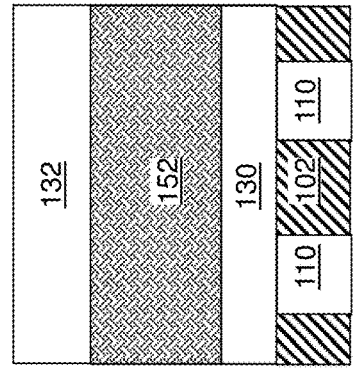
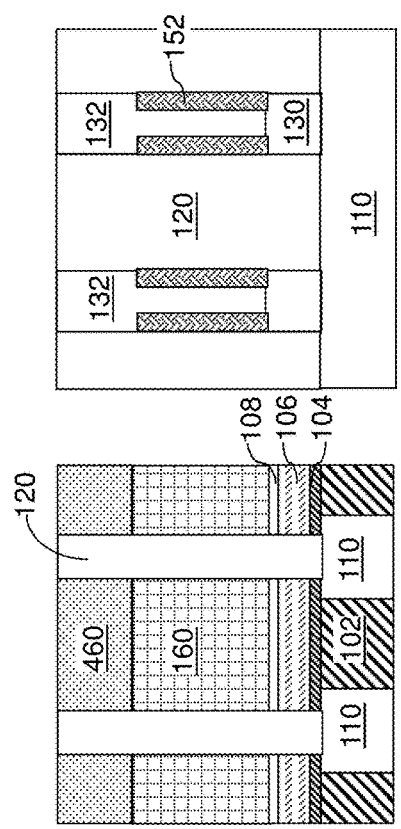

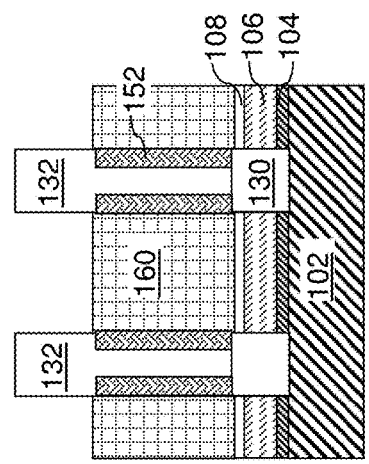
FIG. 7A
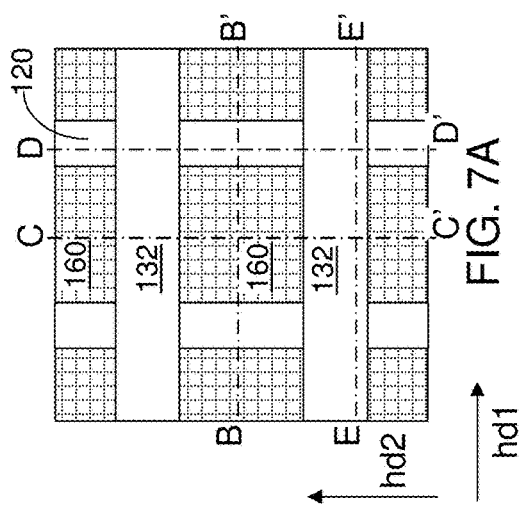
FIG. 7B
FIG. 7C
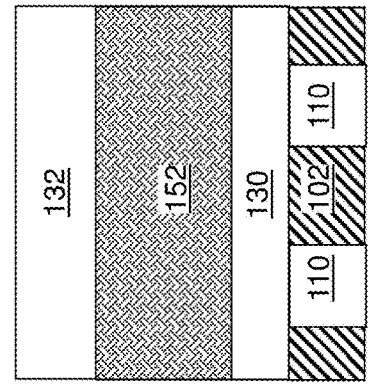
FIG. 7D
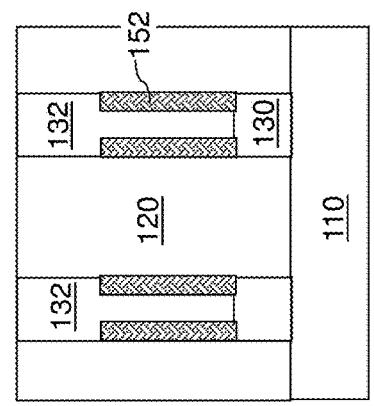
FIG. 7E
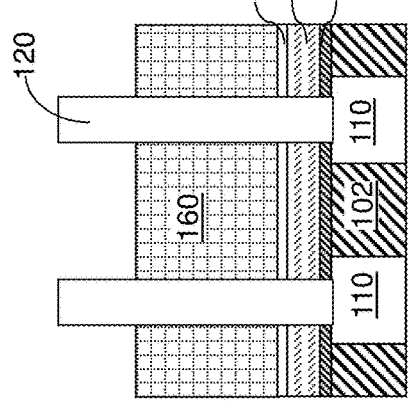

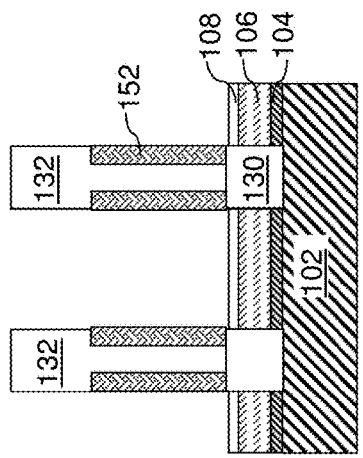
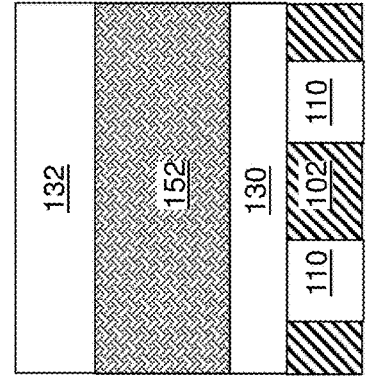
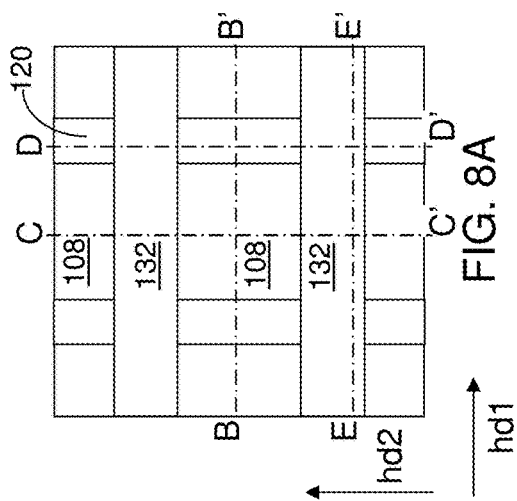
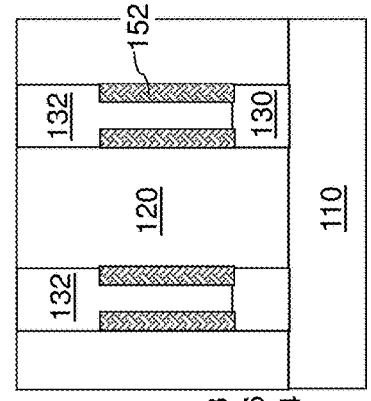
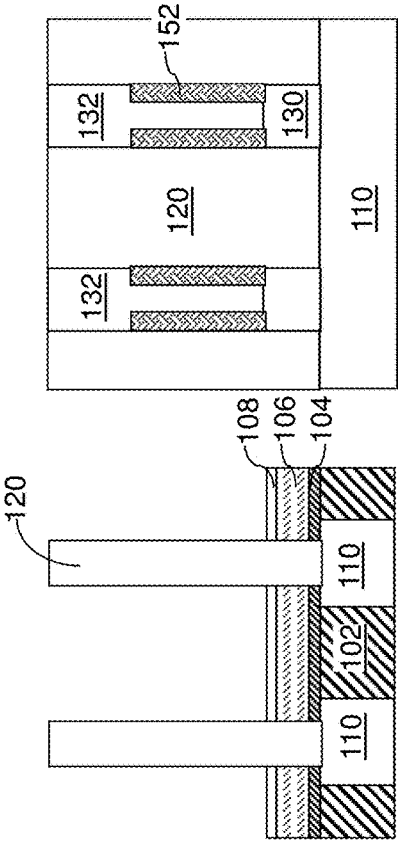
FIG. 8A
FIG. 8B
FIG. 8C
FIG. 8D
FIG. 8E

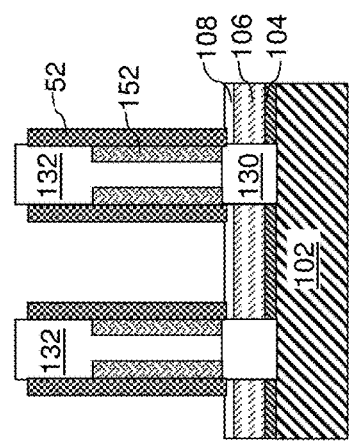
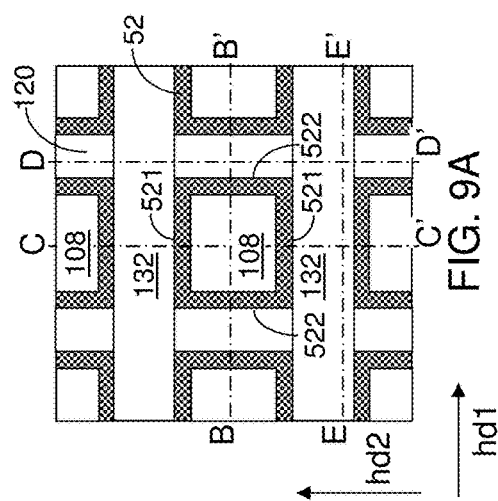
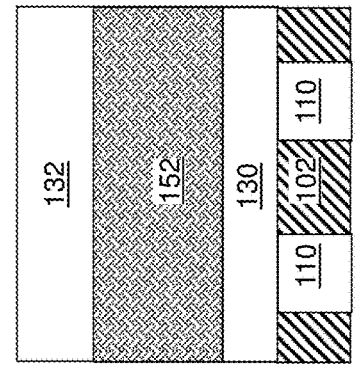
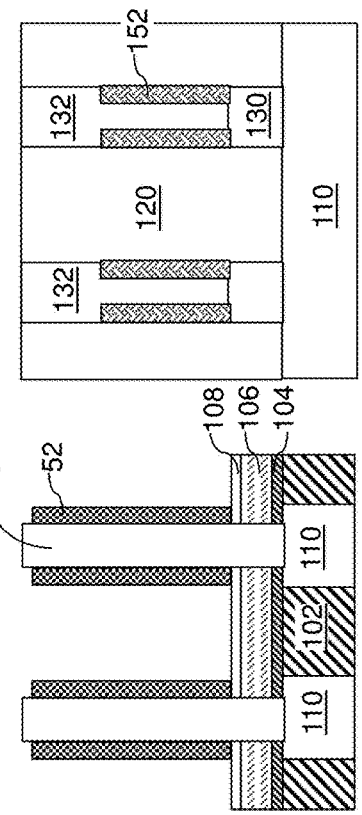

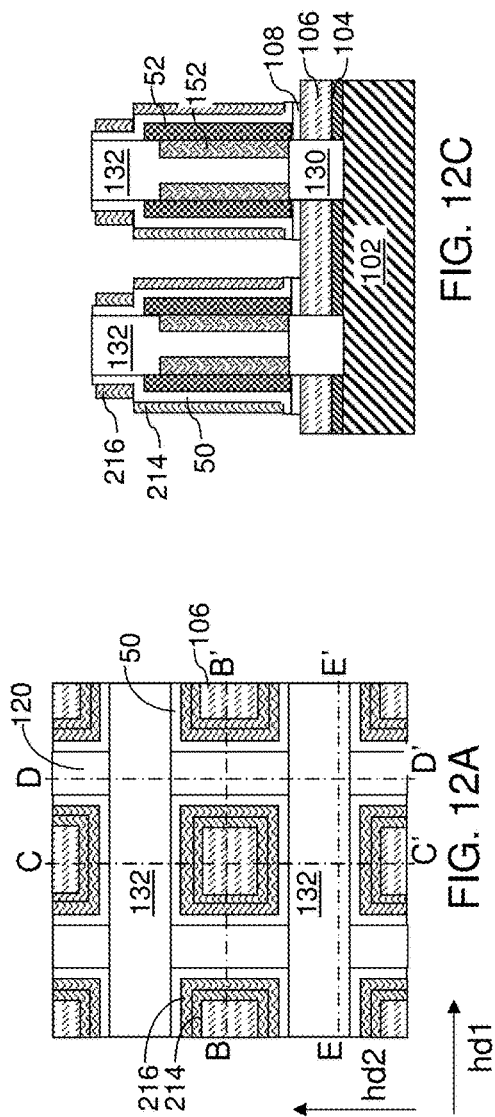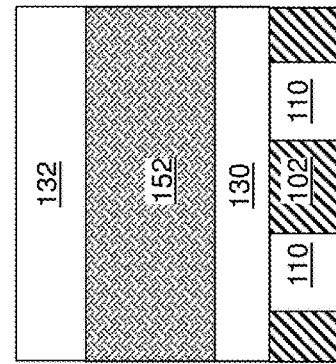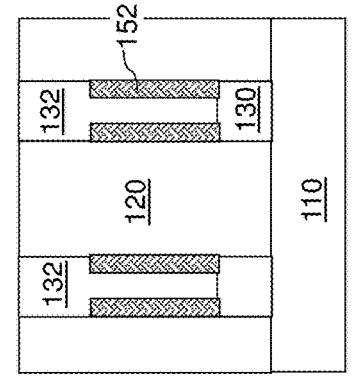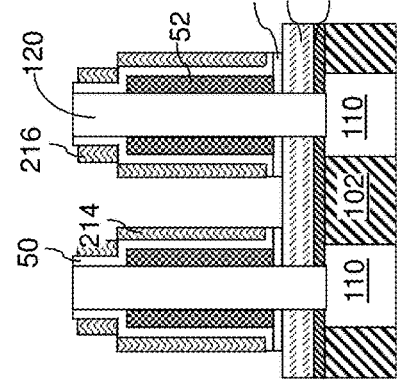

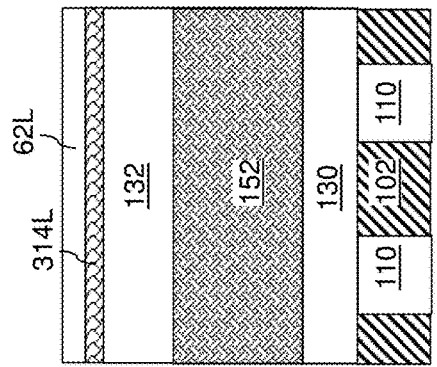
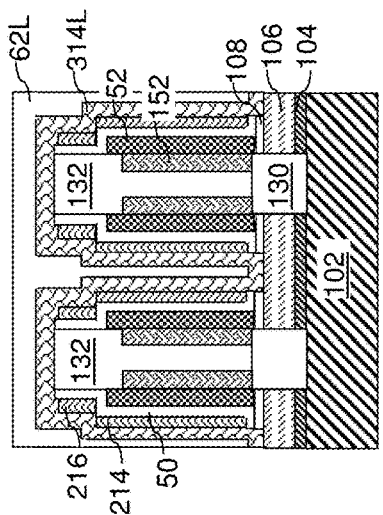
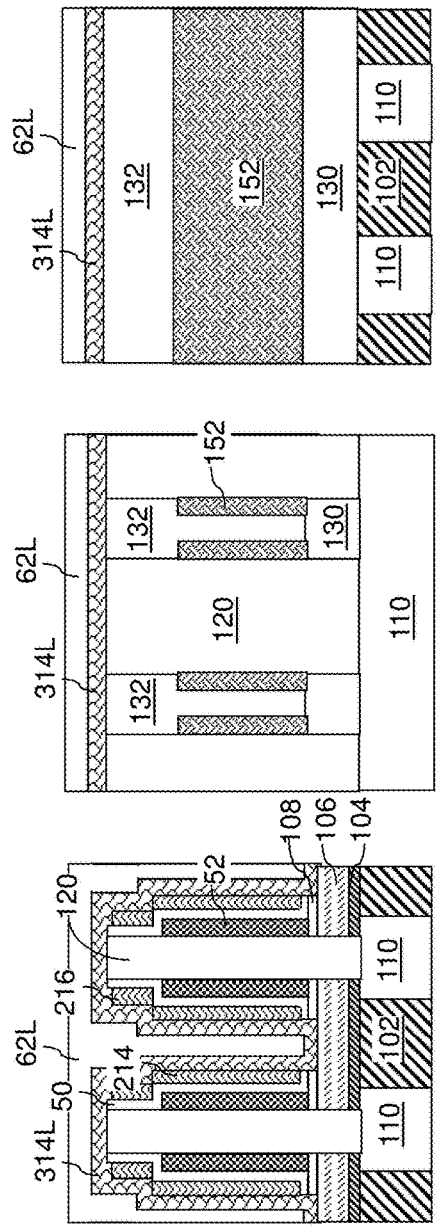
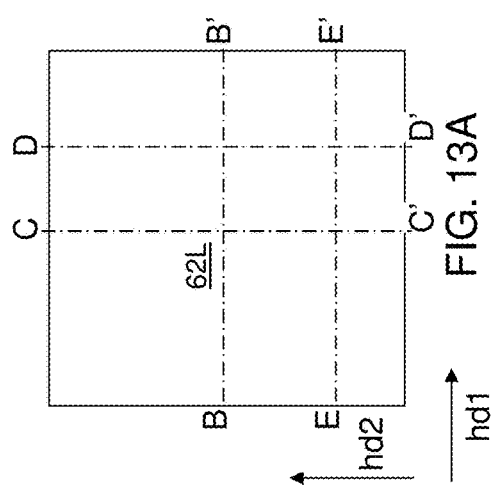

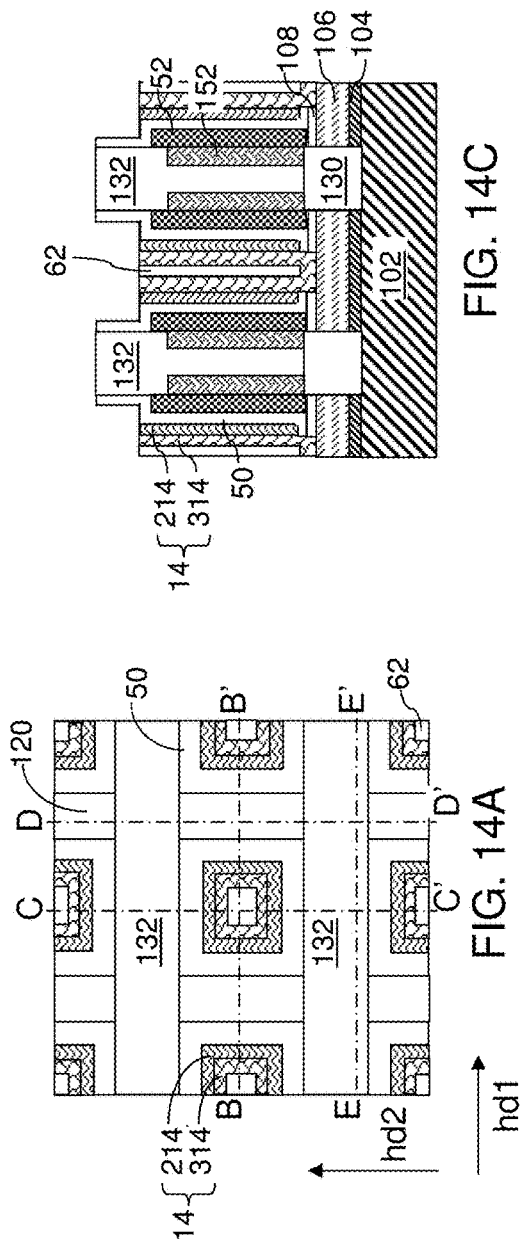
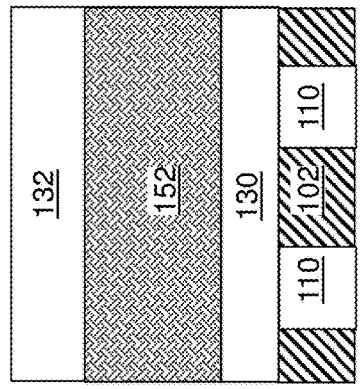
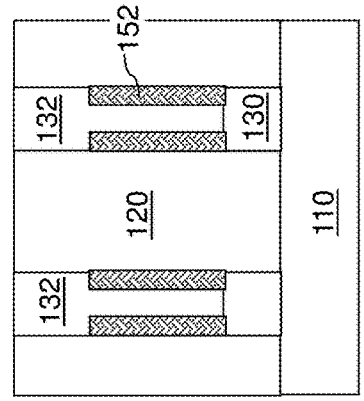
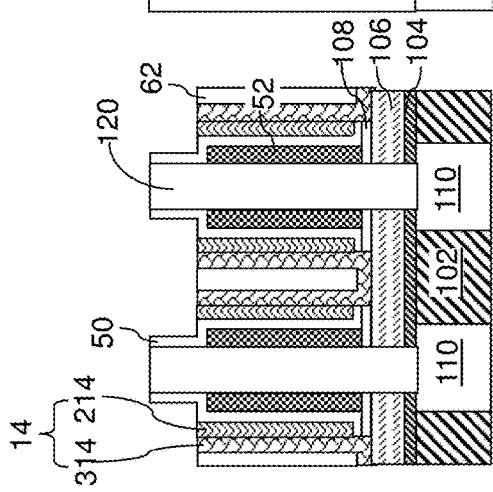

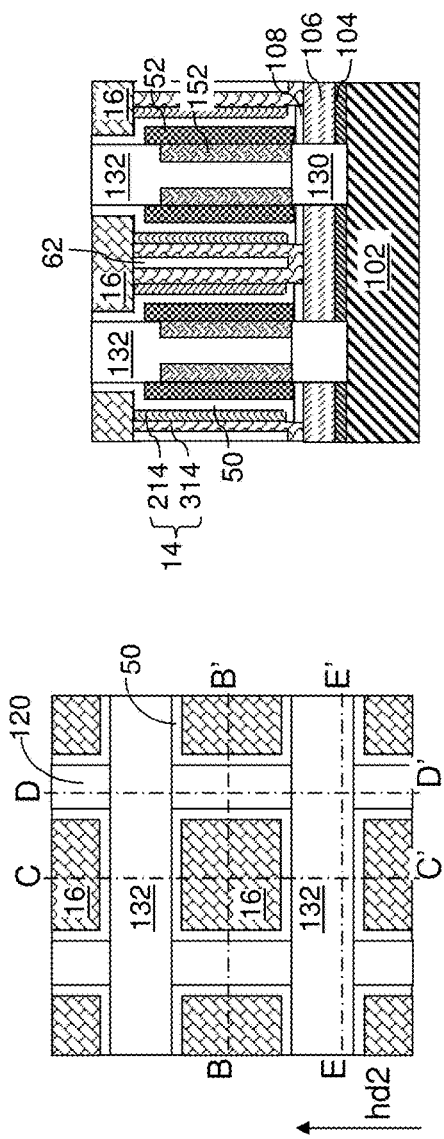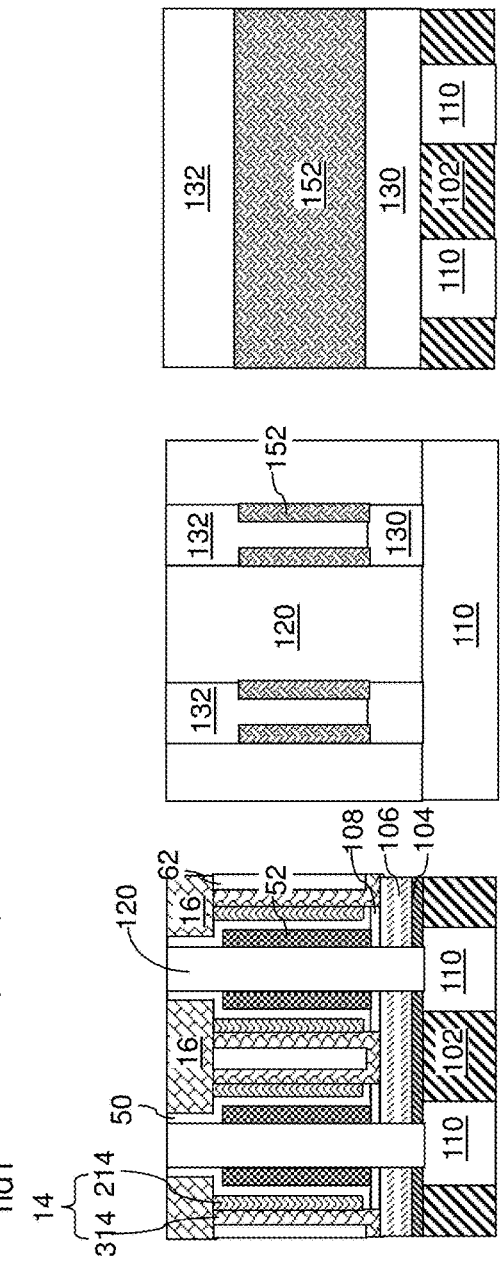

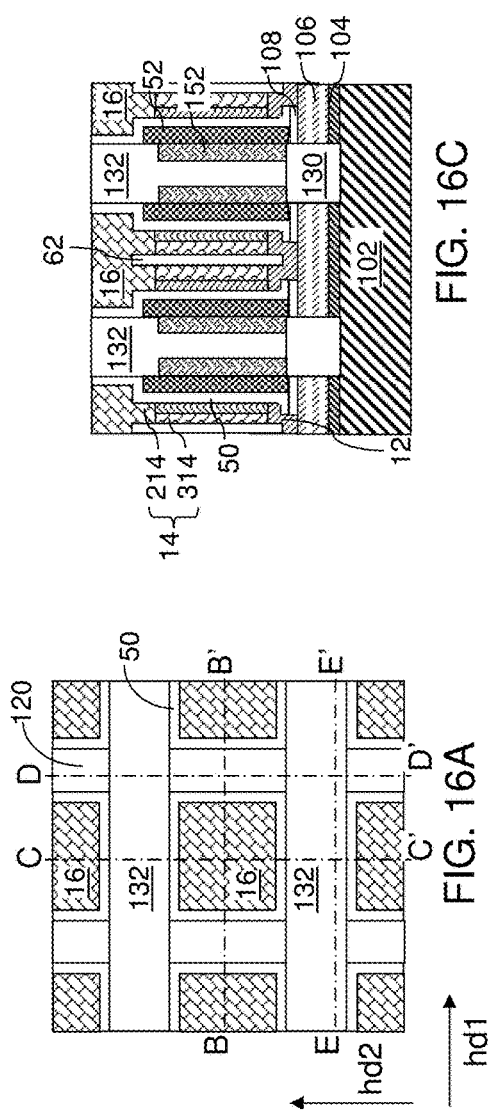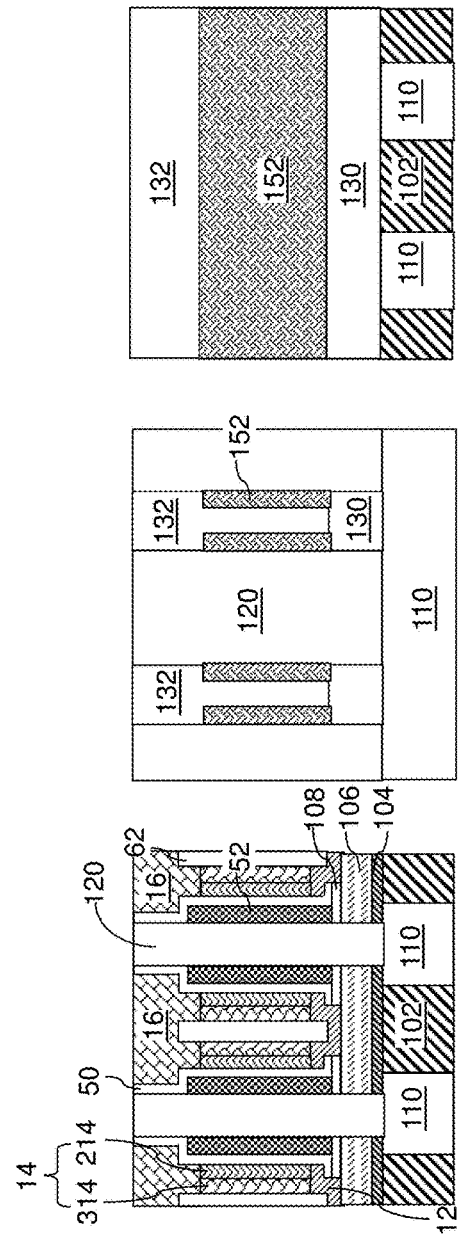

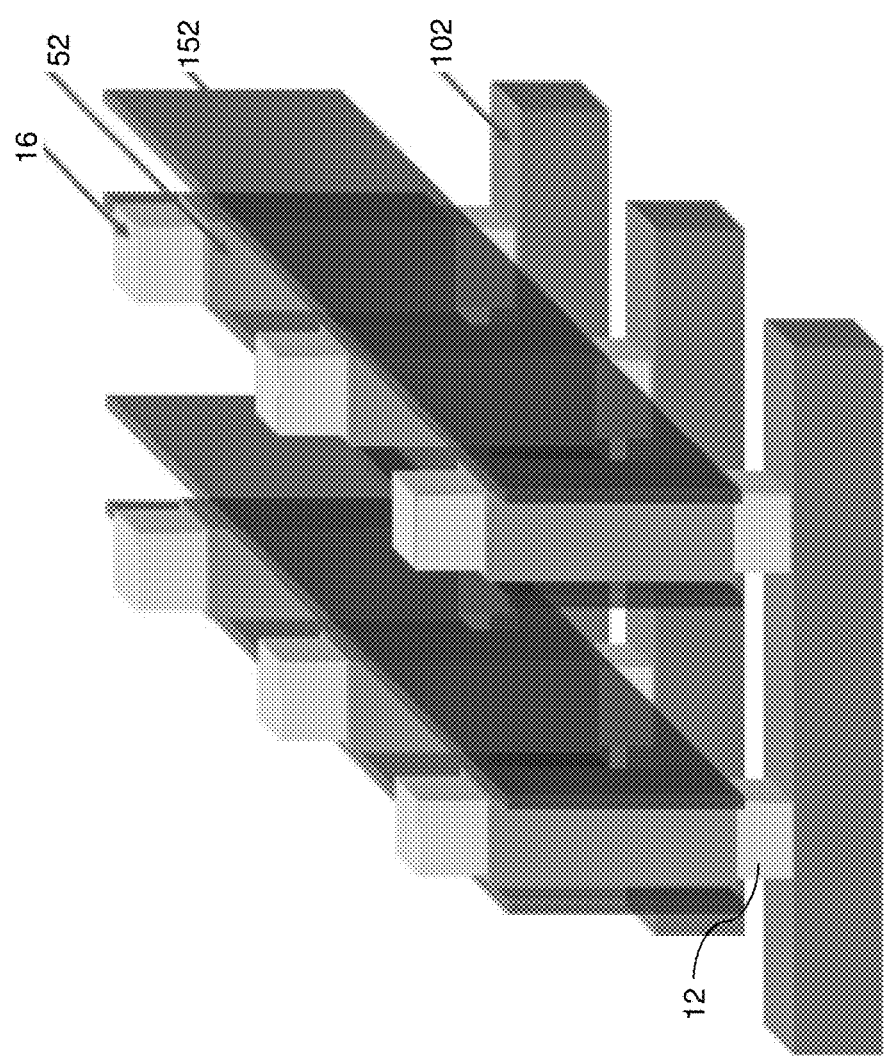

US 10,115,895 B1

VERTICAL FIELD EFFECT TRANSISITORS HAVING A RECTANGULAR SURROUND GATE AND METHOD OF MAKING THE SAME

FIELD

The present disclosure relates generally to the field of semiconductor devices and specifically to a two-dimensional array of surround gate field effect transistors and methods of manufacturing the same.

BACKGROUND

Resistive Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman. A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a semiconductor structure comprising a two-dimensional array of vertical field effect transistors is provided. The two-dimensional array of vertical field effect transistors comprises: a one-dimensional array of gate electrode rail pairs, wherein each of the gate electrode rail pairs comprises a pair of gate electrode rails that laterally extend along a first horizontal direction and spaced among one another along a second horizontal direction; a two-dimensional array of tubular gate electrode portions, wherein each of the tubular gate electrode portions includes a pair of outer sidewalls that contact sidewalls of a respective pair of gate electrode rails; a gate dielectric located inside each of the tubular gate electrode portions; and a vertical semiconductor channel extending along a vertical direction and located inside each of the tubular gate electrode portions and laterally surrounded by the gate dielectric.

According to another aspect of the present disclosure, a method of forming a semiconductor structure is provided, which comprises the steps of: sequentially forming a stack of a doped semiconductor material layer, a planar insulating spacer layer, and a sacrificial matrix layer; laterally dividing the stack along a first horizontal direction by forming dielectric wall structures extending along a second horizontal direction; forming gate trenches through the dielectric wall structures and remaining portions of the stack, wherein each of the gate trenches laterally extend along the first horizontal direction; forming gate electrode rails on sidewalls of remaining portions of the sacrificial matrix layer in the gate trenches; forming a two-dimensional array of rectangular openings by removing remaining portions of the sacrificial matrix layer; forming a two-dimensional array of tubular gate electrode portions in the two-dimensional array of rectangular openings; forming gate dielectrics on sidewalls of the tubular gate electrode portions; and forming vertical semiconductor channels within each of the gate dielectrics by deposition of a semiconductor material.

BRIEF DESCRIPTION OF THE DRAWINGS

FIG. 3A is a top-down view of the exemplary structure after formation of gate trenches according to an embodiment of the present disclosure.

FIGS. 3B-3E are vertical cross-sectional views of the exemplary structure along the vertical planes B-B', C-C', D-D', and E-E' of FIG. 3A.

FIG. 5A is a top-down view of the exemplary structure after formation of gate electrode rails according to an embodiment of the present disclosure.

FIGS. 5B-5E are vertical cross-sectional views of the exemplary structure along the vertical planes B-B', C-C', D-D', and E-E' of FIG. 5A.

FIG. 6A is a top-down view of the exemplary structure after formation of gate divider rail structures according to an embodiment of the present disclosure.

FIGS. 6B-6E are vertical cross-sectional views of the exemplary structure along the vertical planes B-B', C-C', D-D', and E-E' of FIG. 6A.

FIG. 7A is a top-down view of the exemplary structure after removal of hard mask portions according to an embodiment of the present disclosure.

FIGS. 7B-7E are vertical cross-sectional views of the exemplary structure along the vertical planes B-B', C-C', D-D', and E-E' of FIG. 7A.

FIG. 8A is a top-down view of the exemplary structure after removal of remaining portions of the sacrificial matrix layer to form a two-dimensional array of rectangular openings according to an embodiment of the present disclosure.

FIGS. 8B-8E are vertical cross-sectional views of the exemplary structure along the vertical planes B-B', C-C', D-D', and E-E' of FIG. 8A.

FIG. 9A is a top-down view of the exemplary structure after formation of a two-dimensional array of tubular gate electrode portions in the two-dimensional array of rectangular openings according to an embodiment of the present disclosure.

FIGS. 9B-9E are vertical cross-sectional views of the exemplary structure along the vertical planes B-B', C-C', D-D', and E-E' of FIG. 9A.

FIG. 12A is a top-down view of the exemplary structure after anisotropically etching the gate dielectrics and the first vertical channel layer and forming openings through the planar dielectric spacer layer according to an embodiment of the present disclosure.

FIGS. 12B-12E are vertical cross-sectional views of the exemplary structure along the vertical planes B-B', C-C', D-D', and E-E' of FIG. 12A.

FIG. 13A is a top-down view of the exemplary structure after formation of second vertical channel portions and a dielectric core layer according to an embodiment of the present disclosure.

FIGS. 13B-13E are vertical cross-sectional views of the exemplary structure along the vertical planes B-B', C-C', D-D', and E-E' of FIG. 13A.

FIG. 14A is a top-down view of the exemplary structure after formation of vertical semiconductor channels and dielectric cores according to an embodiment of the present disclosure.

FIGS. 14B-14E are vertical cross-sectional views of the exemplary structure along the vertical planes B-B', C-C', D-D', and E-E' of FIG. 14A.

FIG. 15A is a top-down view of the exemplary structure after formation of top active regions according to an embodiment of the present disclosure.

FIGS. 15B-15E are vertical cross-sectional views of the exemplary structure along the vertical planes B-B', C-C', D-D', and E-E' of FIG. 15A.

FIG. 16A is a top-down view of the exemplary structure after formation of bottom active regions according to an embodiment of the present disclosure.

FIGS. 16B-16E are vertical cross-sectional views of the exemplary structure along the vertical planes B-B', C-C', D-D', and E-E' of FIG. 16A.

FIG. 17 is a perspective view of the exemplary structure in which dielectric material portions are omitted for clarity according to an embodiment of the present disclosure.

DETAILED DESCRIPTION

Figure 1A:
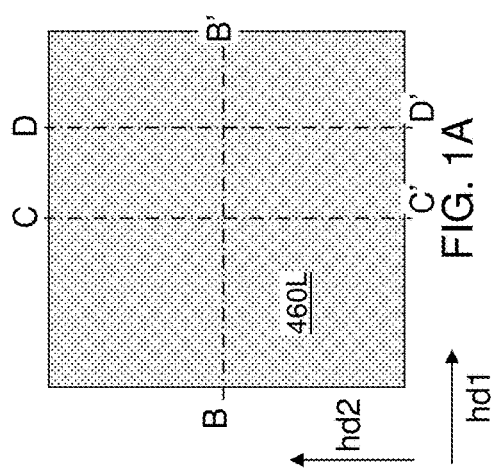
FIG. 1A is a top-down view of an exemplary structure after formation of a laterally alternating sequence of global bit line conductive rails and dielectric separator rails, a metallic layer, a doped semiconductor layer, a planar insulating spacer layer, a sacrificial matrix layer, and a hard mask layer according to an embodiment of the present disclosure.
Figure 1B:
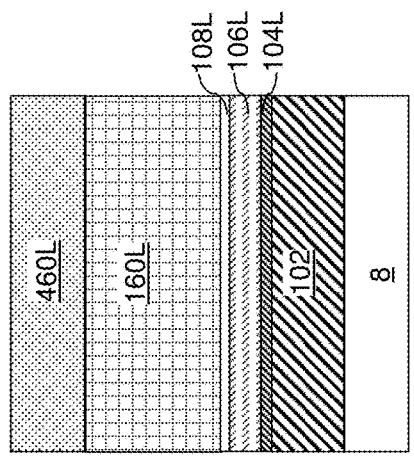
FIGS. 1B-1D are vertical cross-sectional views of the exemplary structure along the vertical planes B-B', C-C', and D-D' of FIG. 1A.
Figure 1C:
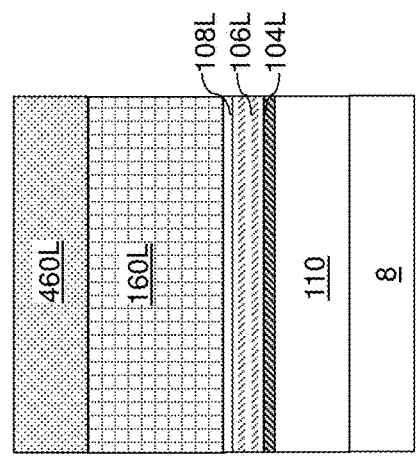
Figure 1D:
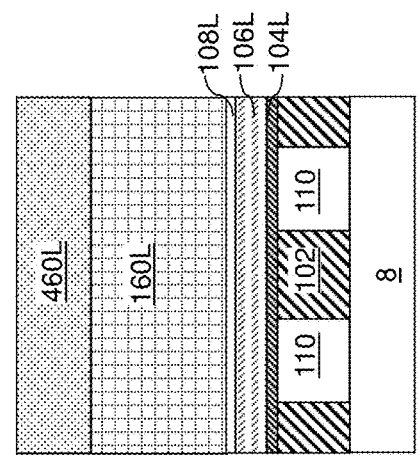
Figure 2A:
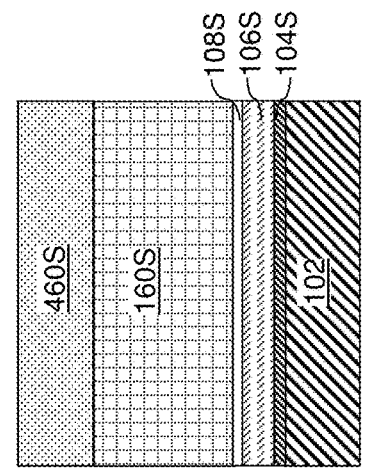
FIG. 2A is a top-down view of the exemplary structure after formation of dielectric wall structures, hard mask strips, sacrificial matrix strips, insulating spacer strips, doped semiconductor strips, and metallic strips according to an embodiment of the present disclosure.
Figure 2C:
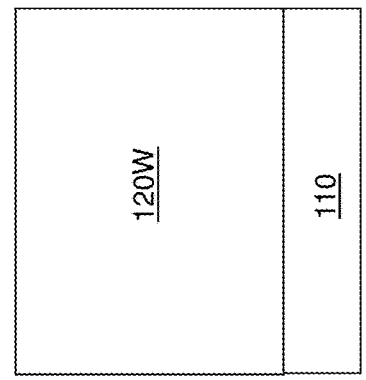
FIGS. 2B-2D are vertical cross-sectional views of the exemplary structure along the vertical planes B-B', C-C', and D-D' of FIG. 2A.
Figure 2B:
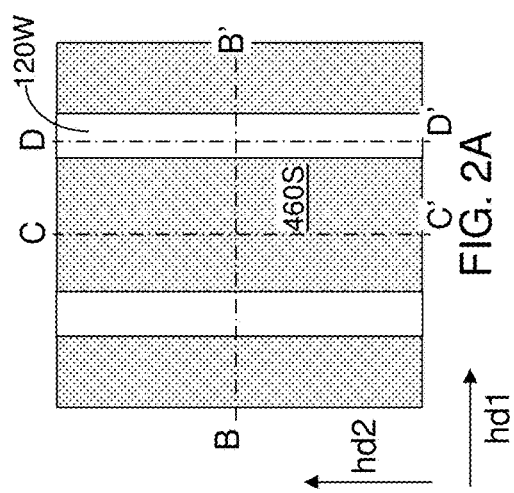
Figure 2D:
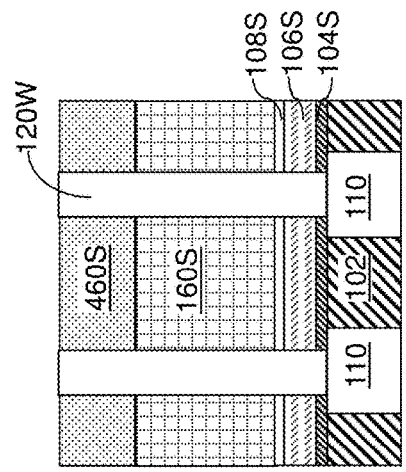
Figure 4A:
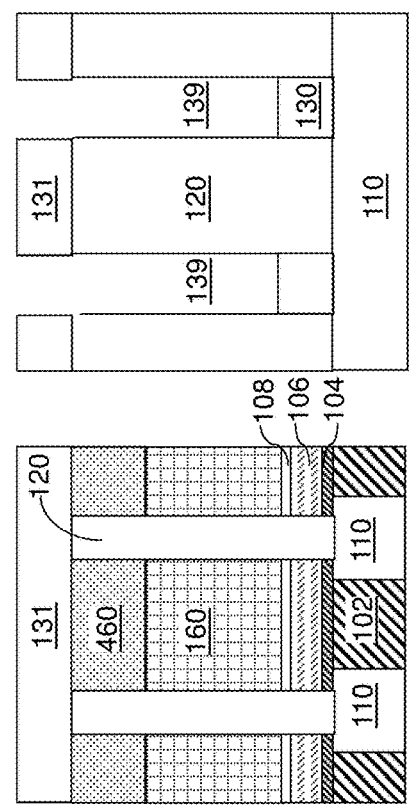
FIG. 4A is a top-down view of the exemplary structure after formation of dielectric gate spacer rails according to an embodiment of the present disclosure.
Figure 4B:
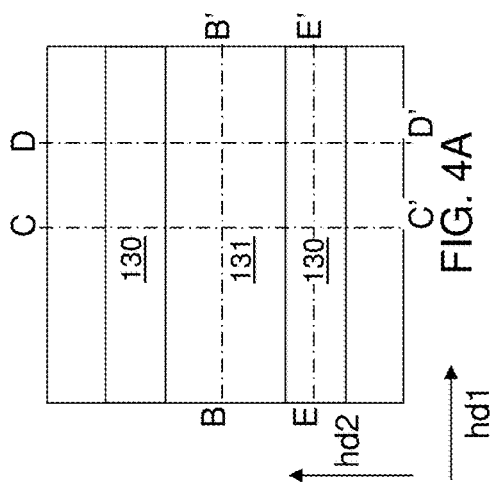
FIGS. 4B-4E are vertical cross-sectional views of the exemplary structure along the vertical planes B-B', C-C', D-D', and E-E' of FIG. 4A.
Figure 4C:
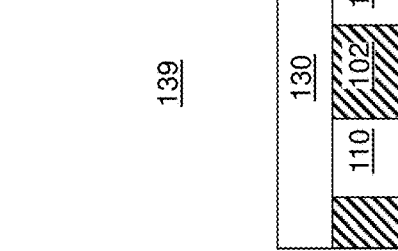
Figure 4D:
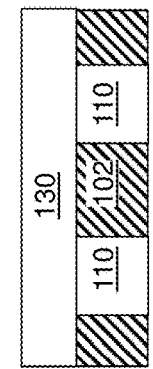
Figure 4E:
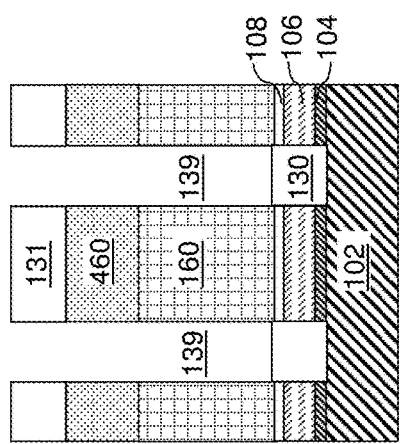
Figure 10E:
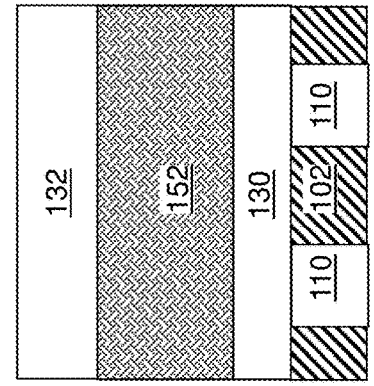
FIGS. 10B-10E are vertical cross-sectional views of the exemplary structure along the vertical planes B-B', C-C', D-D', and E-E' of FIG. 10A.
Figure 10D:
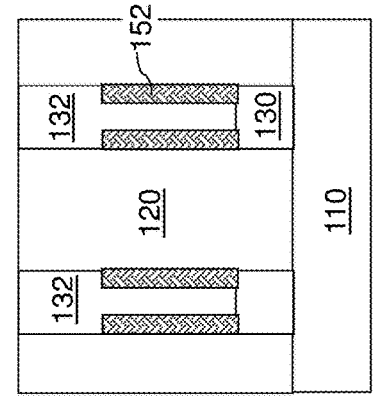
Figure 10C:
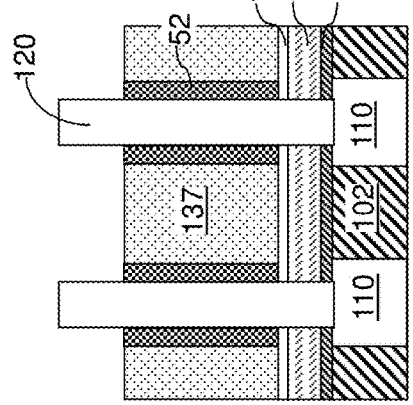
Figure 10A:
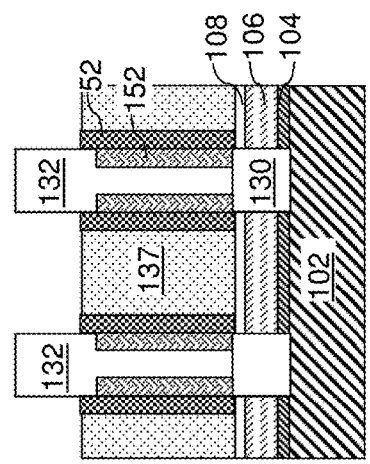
FIG. 10A is a top-down view of the exemplary structure after trimming the tubular gate electrode portions according to an embodiment of the present disclosure.
Figure 10B:
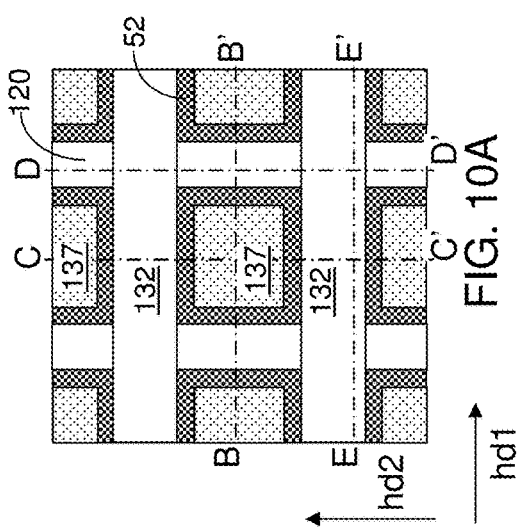
Figure 11A:
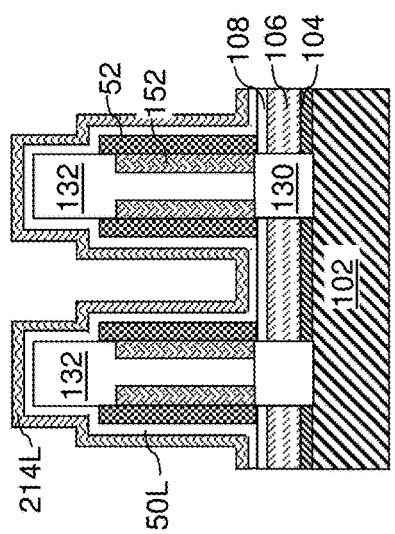
FIG. 11A is a top-down view of the exemplary structure after formation of a gate dielectric layer and a first vertical channel layer according to an embodiment of the present disclosure.
Figure 11B:
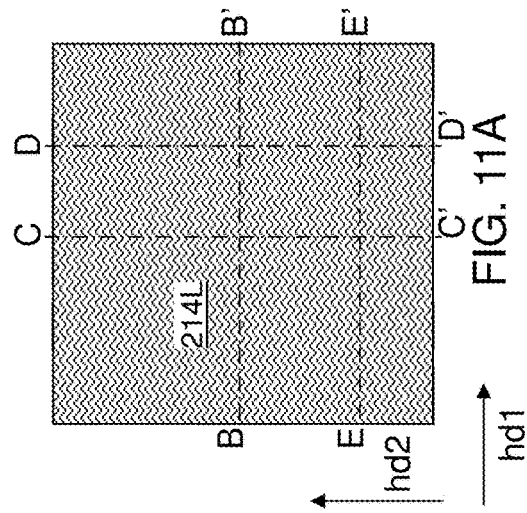
FIGS. 11B-11E are vertical cross-sectional views of the exemplary structure along the vertical planes B-B', C-C', D-D', and E-E' of FIG. 11A.
Figure 11C:
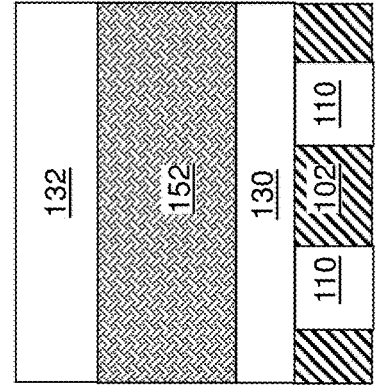
Figure 11D:
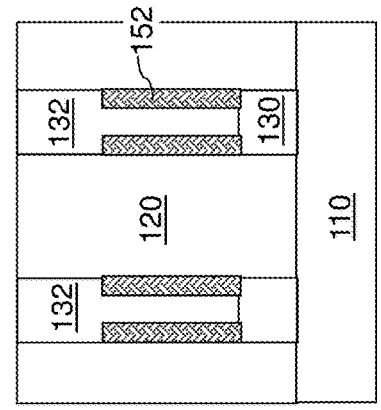
Figure 11E:
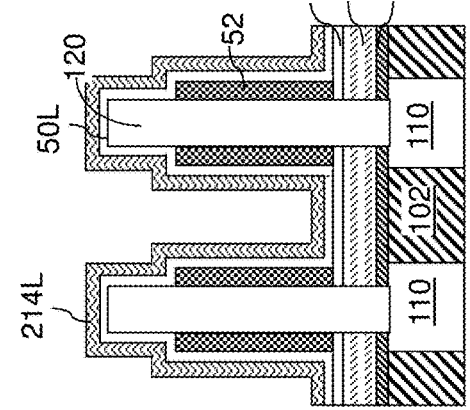

Resistive memory cells of a ReRAM memory device can be arranged in a three-dimensional array that is accessed by a two-dimensional array of vertical bit lines. A two-dimensional array of vertical select field effect transistors can be connected to the two-dimensional array of vertical bit lines to access the resistive memory cells. The present inventors realized that conventional vertical select field effect transistors may contain suboptimum on current and leakage current. Such vertical field effect transistors typically have a dual channel configuration, in which each vertical channel is controlled by a pair of gate electrodes. Typically, each vertical channel has a rectangular horizontal cross-sectional shape, and the pair of gate electrodes controls electron flow along two sidewalls of a rectangular pillar that constitutes the vertical channel. Current flow along the other two sidewalls of the rectangular pillar is only indirectly controlled by the pair of gate electrodes in this configuration. Thus, leakage current and degradation of turn-on characteristics are common in such configurations. In one embodiment of the present disclosure, the vertical select field effect transistor contains a ladder shaped surround select gate electrode which surrounds the entire channel. This configuration can improve the on current of the transistor.

As discussed above, the present disclosure is directed to a two-dimensional array of surround gate field effect transistors and methods of manufacturing the same, the various aspects of which are described below. The embodiments of the disclosure can be employed to form various semiconductor devices, such as three-dimensional monolithic memory array devices comprising ReRAM devices, that include a two-dimensional array of vertical field effect select transistors. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

Referring to FIGS. 1A-1D, an exemplary structure according to an embodiment of the present disclosure is illustrated, which includes an alternating sequence of global bit line conductive rails 102 and dielectric separator rails 110 that is formed over a substrate 8. As used herein, a "rail" refers to a structure that laterally extends in a lengthwise direction. In one non-limiting embodiment, a rail can extend with a uniform vertical cross-sectional shape along the vertical planes that are perpendicular to the lengthwise direction of the structure. The substrate can include semiconductor devices (not shown) and/or metal interconnect structures (not shown) therein.

The global bit line conductive rails 102 include a conductive material (such as tungsten or copper), and the dielectric separator rails 110 include a dielectric material (such as silicon oxide). The alternating sequence of the global bit line conductive rails 102 and the dielectric separator rails 110 can be formed by depositing and patterning the conductive material and the dielectric material such that each global bit line conductive rail 102 is electrically isolated among one another by the dielectric separator rails 110. In one embodiment, the global bit line conductive rails 102 and the dielectric separator rails 102 can laterally extend along a second horizontal direction hd2, and can be laterally spaced among one another along a first horizontal direction hd1. Each of the global bit line conductive rails 102 and the dielectric separator rails 102 can have a uniform width along the second horizontal direction hd2.

A metallic layer 104L, a doped semiconductor layer 106L, a planar insulating spacer layer 108L (e.g., an etch stop layer), a sacrificial matrix layer 160L, and a hard mask layer 460L are sequentially deposited over the alternating sequence of the global bit line conductive rails 102 and the dielectric separator rails 110. The metallic layer 104L includes a metallic material, which can include, for example, titanium nitride, tantalum nitride layer, or tungsten nitride layer. The doped semiconductor layer 106L can include doped polysilicon or doped amorphous silicon (that can be subsequently converted into doped polysilicon through an anneal) having a doping of a first conductivity type (which can be p-type or n-type). The planar insulating spacer layer 108L includes a dielectric material such as silicon oxide. The thickness of the metallic layer 104L can be in a range from 3 nm to 30 nm, the thickness of the doped semiconductor layer 106L can be in a range from 10 nm to 40 nm, and the thickness of the planar insulating spacer layer 108L can be in a range from 4 nm to 40 nm, although lesser and greater thicknesses can be employed for each layer.

The sacrificial matrix layer 160L can include a sacrificial material that can be removed selective to the planar insulating spacer layer 108L and various dielectric material portions to be formed through the sacrificial matrix layer 160L. For example, the sacrificial matrix layer 160L can include a sacrificial material such as amorphous silicon, polysilicon, a silicon-germanium alloy, amorphous carbon, or a silicon-based polymer material. The thickness of the sacrificial matrix layer can be in a range from 50 nm to 500 nm, such as from 100 nm to 300 nm, although lesser and greater thicknesses can also be employed.

The hard mask layer 460L can be formed over the sacrificial matrix layer 160L. The hard mask layer 460L includes a dielectric material such as silicon nitride. The thickness of the hard mask layer 40L can be in range from 10 nm to 100 nm, such as from 20 nm to 80 nm, although lesser and greater thicknesses can also be employed.

Referring to FIGS. 2A-2D, a photoresist layer (not shown) can be applied over the hard mask layer 460L, and can be lithographically patterned to form linear openings that extend along the second horizontal direction hd2 and within areas overlying the dielectric separator rails 110. The pattern in the photoresist layer can be transferred through the stack of the hard mask layer 460L, the sacrificial matrix layer 160L, the planar insulating spacer layer 108L, the doped semiconductor layer 106L, and the metallic layer 104L by an anisotropic etch. The etch chemistry of the anisotropic etch can be adjusted to sequentially etch through the various layers within the stack of hard mask layer 460L, the sacrificial matrix layer 160L, the planar insulating spacer layer 108L, the doped semiconductor layer 106L, and the metallic layer 104L.

Each remaining portion of the hard mask layer 460L is herein referred to as a hard mask strip 460S, each remaining portion of the sacrificial matrix layer 160L is herein referred to as a sacrificial matrix strip 160S, each remaining portion of the planar insulating spacer layer 108L is herein referred to as a planar insulating spacer strip 108S, each remaining portion of the doped semiconductor layer 106L is herein referred to as a doped semiconductor strip 106S, and each remaining portion of the metallic layer 104L is herein referred to as a metallic strip 104S. Line cavities laterally extending along the second horizontal direction hd2 are formed between neighboring stacks of a hard mask strip 460S, a sacrificial matrix strip 160S, a planar insulating spacer strip 108S, a doped semiconductor strip 106S, and a metallic strip 104S. The photoresist layer can be subsequently removed, for example, by ashing.

A dielectric material is deposited in the line cavities. The dielectric material may comprise silicon oxide. Alternatively, the dielectric material may comprise a silicon nitride liner surrounding a silicon oxide fill. Excess portions of the dielectric material can be removed from above the top surfaces of the hard mask strips 460S by a planarization process such as chemical mechanical planarization (CMP) or a recess etch process. Each remaining portion of the dielectric material in the line trenches is herein referred to as a dielectric wall structure 120W. Each dielectric wall structure 120W can laterally extend along the second horizontal direction hd2, and can have a uniform width along the first horizontal direction hd1. The lateral width of each dielectric wall structure 120W (as measured along the first horizontal direction hd1) can be in a range from 30 nm to 300 nm, such as from 60 nm to 150 nm, although lesser and greater lateral widths can also be employed. The stack of hard mask layer 460L, the sacrificial matrix layer 160L, the planar insulating spacer layer 108L, the doped semiconductor layer 106L, and the metallic layer 104L is laterally divided along the first horizontal direction by forming the dielectric wall structures 120W that extend along the second horizontal direction hd2.

Referring to FIGS. 3A-3E, a photoresist layer (not shown) can be applied over the hard mask layer 460L and the dielectric wall structures 120W, and can be lithographically patterned to form linear openings that extend along the first horizontal direction hd1. The pattern in the photoresist layer can be transferred through the dielectric wall structures 120W, the hard mask strips 460S, the sacrificial matrix strips 160S, the planar insulating spacer strips 108S, the doped semiconductor strips 106S, and the metallic strips 104S by an anisotropic etch. The etch chemistry of the anisotropic etch can be adjusted to sequentially etch through the various materials of the dielectric wall structures 120W, the hard mask strips 460S, the sacrificial matrix strips 160S, the planar insulating spacer strips 108S, the doped semiconductor strips 106S, and the metallic strips 104S, and to stop on the top surfaces of the global bit line conductive rails 102 and the dielectric separator rails 110.

Each remaining portion of the hard mask strips 460S is herein referred to as a hard mask portion 460, each remaining portion of the sacrificial matrix strips 160S is herein referred to as a sacrificial pillar structure 160, each remaining portion of the planar insulating spacer strips 108S is herein referred to as a planar insulating spacer portion 108, each remaining portion of the doped semiconductor strips 106S is herein referred to as a doped semiconductor portion 106, and each remaining portion of the metallic strips 104S is herein referred to as a metallic portion 104. Each remaining portion of the dielectric wall structure 120W is herein referred to as a dielectric pillar structure 120. Gate trenches 139 laterally extending along the first horizontal direction hd1 are formed between neighboring pairs of contiguous sets of hard mask portions 460, sacrificial pillar structures 160, planar insulating spacer portions 108, doped semiconductor portions 106, metallic portions 104, and dielectric pillar structures 120. The photoresist layer can be subsequently removed, for example, by ashing. An alternating sequence of sacrificial pillar structures 160 and dielectric pillar structures 120 is formed between each neighboring pair of gate trenches 139, as shown in FIG. 3B.

Referring to FIGS. 4A-4E, a dielectric material is anisotropically deposited at the bottom portions of the gate trenches 139. The dielectric material can be anisotropically deposited by high density plasma (HDP) oxide chemical vapor deposition or physical vapor deposition (PVD), which can deposit the dielectric material with a greater thickness on horizontal surfaces than on vertical surfaces. An isotropic etch process such as a wet etch process can be performed to remove vertical portions of the deposited dielectric material from the sidewalls of the sacrificial pillar structures 160 and the hard mask portions 460.

Each remaining portion of the deposited dielectric material at the bottom of the gate trenches 139 constitutes a dielectric gate spacer 130. The dielectric gate spacers 130 laterally extend along the first horizontal direction hd1, and can have a uniform width along the second horizontal direction hd2. Each of the dielectric gate spacers 130 can have a top surface that is located above the horizontal plane including the bottom surface of the planar insulation spacer portions 108. In one embodiment, the top surfaces of the dielectric gate spacers 130 can be located at, or above, the horizontal plane including the top surfaces of the planar insulating spacer portions 108. Each remaining portion of the deposited dielectric material overlying the hard mask portions 460 constitutes a dielectric rail structure 131 that laterally extend along the first horizontal direction hd1. The dielectric rail structure 131 can be subsequently removed by chemical mechanical planarization right after deposition or subsequently during the planarization step shown in FIGS. 6A-6E.

Referring to FIGS. 5A-5E, a gate rail material layer is subsequently deposited in the gate trenches 139 (and over the dielectric rail structures 131 if they are still present). The gate rail material layer includes a conductive material such as a metallic material or a heavily doped semiconductor material. For example, the gate rail material layer can include an elemental metal (e.g., tungsten), an intermetallic alloy, and/or a conductive metal nitride such as TiN, TaN, or WN. The gate rail material layer can be deposited by a conformal deposition process such as chemical vapor deposition (CVD) or atomic layer deposition (ALD). The thickness of the gate rail material layer can be less than one half of the width of the gate trenches 139. The thickness of the gate rail material layer can be in a range from 5 nm to 100 nm, such as from 10 nm to 50 nm, although lesser and greater thicknesses can also be employed.

An anisotropic etch process is performed to remove horizontal portions of the gate rail material layer from above the top surfaces of the dielectric pillar structures 120 and the hard mask portions 460 (or the top surfaces of the dielectric rail structures 131 if they are still present) and at the bottom of each gate trench 139. Remaining vertical portions of the gate rail material layer constitute gate electrode rails 152. Each gate electrode rail 152 laterally extends along the first horizontal direction hd1, and can have a uniform vertical cross-sectional shape within vertical planes that are perpendicular to the first horizontal direction hd1 that is invariant with translation along the first horizontal direction hd1. Each gate electrode rail 152 can contact a top surface of a dielectric gate spacer 130 and sidewalls of a set of sacrificial pillar structures 160 and dielectric pillar structures 120. A line cavity 139' is present within the unfilled volume of each gate trench 139.

Referring to FIGS. 6A-6E, a dielectric material such as silicon oxide is deposited in the line cavities 139' by a conformal deposition process. Optionally, a reflow process can be performed to remove or reduce any cavity that may be formed within volumes of the line cavities 139'. Excess portions of the dielectric material can be removed from above the horizontal plane including top surfaces of the hard mask portions 460 by a planarization process such as chemical mechanical planarization. The dielectric rail structures 131 can also be removed during the planarization process if they are still present at this stage of the process. Remaining portions of the dielectric material filling the line cavities 139' constitute gate divider rail structures 132. The gate divider rail structures 132 laterally extend along the first horizontal direction hd1. Each gate divider rail structure 132 can have a uniform vertical cross-sectional shape within vertical planes that are perpendicular to the first horizontal direction hd1. The top surfaces of the gate divider rail structures 132 can be within the same horizontal plane as the top surfaces of the hard mask portion 460.

Referring to FIGS. 7A-7E, the hard mask portions 460 can be removed selective to the gate divider rail structures 132 and the dielectric pillar structures 120. For example, if the hard mask portions 460 include silicon nitride and if the gate divider rail structures 132 and the dielectric pillar structures 120 include silicon oxide, a wet etch process employing hot phosphoric acid can be employed to remove the hard mask portions 460 selective to the gate divider rail structures 132 and the dielectric pillar structures 120. A recessed region having a rectangular horizontal cross-sectional shape is formed in each volume from which the hard mask portions 460 are removed.

Referring to FIGS. 8A-8E, the sacrificial pillar structures 160 can be removed selective to the gate divider rail structures 132, the dielectric pillar structures 120, the gate electrode rails 152, and the planar insulating spacer portions 108. A selective etch process can be performed to remove the sacrificial pillar structures 160, which are remaining portions of the sacrificial matrix layer 160L, selective to materials of the gate divider rail structures 132 and the dielectric pillar structures 120 (which are remaining portions of the dielectric wall structures 120W). For example, if the sacrificial pillar structures 160 include amorphous silicon or polysilicon, a wet etch employing a KOH solution or hot a trimethyl-2 hydroxyethyl ammonium hydroxide (TMY) solution can be employed to remove the sacrificial pillar structures 160 selective to the gate divider rail structures 132, the dielectric pillar structures 120, the gate electrode rails 152, and the planar insulating spacer portions 108. A two-dimensional array of rectangular openings is formed in the volumes from which the hard mask portions 460 and the sacrificial pillar structures 460 are removed.

Referring to FIGS. 9A-9E, a conductive material is deposited by a conformal deposition method to form a gate electrode material layer for the surround gates. The gate electrode material layer can include a metallic material such as a metal (e.g., tungsten), a conductive metallic nitride (such as TiN, TaN, or WN) or a doped semiconductor material (such as doped amorphous silicon or doped polysilicon). The thickness of the gate electrode material layer can be in a range from 5 nm to 100 nm, such as from 10 nm to 50 nm, although lesser and greater thicknesses can also be employed.

An anisotropic etch process is performed to remove horizontal portions of the gate electrode material layer. Each remaining vertical portion of the gate electrode material layer has a configuration of a tube (e.g., a rectangular tube), and is herein referred to as a tubular gate electrode portion 52. A two-dimensional array of tubular gate electrode portions 52 is formed in the two-dimensional array of rectangular openings. Each of the tubular gate electrode portions 52 includes a pair of first outer sidewalls 521 that contact sidewalls of a respective pair of gate electrode rails 152 and a pair of second outer sidewalls 522 that contact the dielectric pillar structures 120 which are the remaining portions of the dielectric wall structures 120W. A row of tubular gate electrode portions 52 physically contacts, and is electrically shorted to, a pair of gate electrode rails 152 to form a surrounding gate structure.

Referring to FIGS. 10A-10E, a trimming mask material is deposited in a two-dimensional array of openings that are present after formation of the tubular gate electrode portions 52. The trimming mask material can include any sacrificial material which can be selectively etched compared to the remaining structure materials, such as a photoresist material, amorphous silicon, polysilicon, a silicon-germanium alloy, amorphous carbon, diamond-like carbon (DLC), or a silicon-based polymer. The trimming mask material is planarized employing the top surfaces of the gate divider rail structures 132 and the dielectric pillar structures 120. For example, excess portions of the trimming mask material can be removed from above the horizontal plane including the top surfaces of the gate divider rail structures 132 and the dielectric pillar structures 120 by a planarization process such as chemical mechanical planarization. Subsequently, the trimming mask material can be vertically recessed by a predetermined depth by a recess etch. Each remaining portion of the trimming mask material forms a trimming mask material portion 137, which can have a shape of a rectangular parallelepiped.

A trimming etch process is performed to remove upper segments of the tubular gate electrode portions 52 that protrude above the top surfaces of the trimming mask material portions 137. An isotropic etch that etches the material of the tubular gate electrode portions 52 selective to the materials of the gate divider rail structures 132, the dielectric pillar structures 120, and the trimming mask material portion 137 can be employed. In case the tubular gate electrode portions 52 include a metallic material and the gate divider rail structures 132 and the dielectric pillar structures 120 include silicon oxide or a silicon nitride liner filled with silicon oxide fill, a wet etch process that etches the metallic material selective to silicon oxide and the material of the trimming mask material portions 137 can be employed. The height of the tubular gate electrode portions 52 after trimming can be, for example, in a range from 40 nm to 400 nm, such as from 80 nm to 250 nm, although lesser and greater heights can also be employed. Subsequently, the trimming mask material portions 137 can be removed selective to the tubular gate electrode portions 52, the gate divider rail structures 132, the dielectric pillar structures 120, and the planar insulating spacer portions 108 by ashing or by an isotropic etch process.

Referring to FIGS. 11A-11E, a gate dielectric layer 50L and a first vertical channel layer 214L can be sequentially formed. The gate dielectric layer 50L can be formed by conformal deposition of at least one dielectric material on sidewalls of the tubular gate electrode portions 52, which can include silicon oxide and/or a dielectric metal oxide. The first vertical channel layer 214L includes an intrinsic semiconductor material or a semiconductor material having a doping of a second conductivity type, which is the opposite of the first conductivity type. For example, if the first conductivity type is n-type, the second conductivity type can be p-type, and vice versa. For example, the first vertical channel layer 214L can include intrinsic or doped amorphous silicon or doped polysilicon, and can have a thickness in a range from 3 nm to 100 nm, such as from 6 nm to 50 nm, although lesser and greater thicknesses can also be employed.

Referring to FIGS. 12A-12E, an anisotropic etch process can be performed to remove horizontal portions of the first vertical channel layer 214L and the gate dielectric layer 50L. Remaining portions of the gate dielectric layer 50L constitute gate dielectrics 50. The gate dielectrics 50 are formed on inner sidewalls of the tubular gate electrode portions 52. The gate dielectrics 50 can have L-shaped vertical cross-sectional shapes. Each gate dielectric 50 can have a rectangular cylindrical portion having an inner vertical sidewall and an outer vertical sidewall, and a "foot" portion including an opening of a lesser maximum lateral dimension than the maximum lateral dimension (which is the diagonal) of the opening of the overlying rectangular cylindrical portion.

Each remaining portion of the first vertical channel layer 214L at the level of the tubular gate electrode portions 52 constitutes a first vertical channel portion 214. Each first vertical channel portion 214 includes an inner vertical sidewall and an outer vertical sidewall. Each first vertical channel portion 214 can have the shape of a rectangular cylinder. Optionally, a rectangular annular semiconductor structure 216 can be formed above each first vertical channel portion 214. The maximum lateral dimension (between opposing corners of the rectangular outer perimeter) of the rectangular annular semiconductor structure 216 can be less than the maximum lateral dimension of the underlying first vertical channel portion 214.

The anisotropic etch can continue to etch physically exposed portions of the planar insulating spacer portions 108 underneath rectangular openings within the first vertical channel portions 214. Rectangular openings are formed through the planar insulating spacer portions 108 by the anisotropic etch process. Portions of the top surfaces of the doped semiconductor portions 106 are physically exposed underneath the rectangular openings through the planar insulating spacer portions 108. Each planar insulating spacer portions 108 has a rectangular annular shape, in which a rectangular outer periphery is laterally spaced from a rectangular inner periphery by a uniform distance. The uniform distance can be the same as the sum of the thickness of a vertical portion of a tubular gate electrode portion 52, the thickness of a gate dielectric 50, and the thickness of a vertically extending segment of a first vertical channel portion 214. A rectangular top surface of a doped semiconductor portion 106 is physically exposed underneath each opening through the planar insulating spacer portions 108.

Referring to FIGS. 13A-13E, a second vertical channel layer 314L including an intrinsic semiconductor material or a doped semiconductor material having a doping of the second conductivity type can be deposited in the openings through the tubular gate electrode portions 52 and the planar insulating spacer portions 108 by a conformal deposition process. In case the volumes of the openings are not completely filled with the second vertical channel layer 314L, a dielectric core material layer 62L including a dielectric material such as silicon oxide may be deposited in remaining volumes of the openings.

Referring to FIGS. 14A-14E, a first anisotropic etch process can be performed to remove horizontal portions of the dielectric core material layer 62L from above the top surfaces of the gate divider rail structures 132 and the dielectric pillar structures 120. The dielectric core material layer 62L can be further recessed such that top surfaces of the remaining portions of the dielectric core material layer 62L are recessed below the horizontal plane including the top surfaces of the gate divider rail structures 132 and the dielectric pillar structures 120. Each remaining portion of the dielectric core material layer 62L constitutes a dielectric core 62, which can have the shape of a rectangular parallelepiped.

A second anisotropic etch process can be performed to remove horizontal portions of the second vertical channel layer 314L from above the top surfaces of the gate divider rail structures 132 and the dielectric pillar structures 120. The second vertical channel layer 314L can be further recessed such that top surfaces of the remaining portions of the second vertical channel layer 314L are recessed below the horizontal plane including the top surfaces of the gate divider rail structures 132 and the dielectric pillar structures 120. In one embodiment, the rectangular annular semiconductor structures 216 can be collaterally etched during recessing of the second vertical channel layer 314L. Each remaining portion of the second vertical channel layer 314L constitutes a second vertical channel portion 314. Each physically adjoined pair of a first vertical channel portion 214 and a second vertical channel portion 314 constitutes a vertical semiconductor channel 14 which is intrinsic (i.e., undoped) or having a doping of the second conductivity type.

Referring to FIGS. 15A-15E, a doped semiconductor material layer having a doping of the first conductivity type can be deposited in the recessed regions overlying the dielectric cores 62 and the vertical semiconductor channels 14 by a conformal or non-conformal deposition process. The doped semiconductor material layer may be formed within in-situ doping with dopants of the first conductivity type. Alternatively, an undoped or doped semiconductor material layer can be deposited and dopants of the first conductivity type can be subsequently implanted to form the doped semiconductor material layer.

A planarization process such as a recess etch and/or chemical mechanical planarization (CMP) can be performed to remove portions of the doped semiconductor material layer from above the horizontal plane including the top surfaces of the gate divider rail structures 132 and the dielectric pillar structures 120. Remaining portions of the doped semiconductor material layer having a doping of the first conductivity type and located over the vertical semiconductor channels 14 constitute top active regions 16. Each top active region 16 can be laterally surrounded by a gate dielectric 50, which can be laterally surrounded by a pair of gate divider rail structures 132 and a pair of dielectric pillar structures 120.

Referring to FIGS. 16A-16E, an anneal process is performed at an elevated temperature to induce outdiffusion of electrical dopants from the doped semiconductor portions 106. Lower portions of the vertical semiconductor channels 14 can be converted into bottom active regions 12 having a doping of the first conductivity type by the anneal process. Further, upper portions of the vertical semiconductor channels 14 can be converted during the anneal process into regions having a doping of the first conductivity type, which are incorporated into the top active regions 16.

FIG. 17 provides a perspective view of the resulting exemplary structure of FIGS. 16A-16E in which various dielectric material portions are omitted for clarity.

Figure 18:
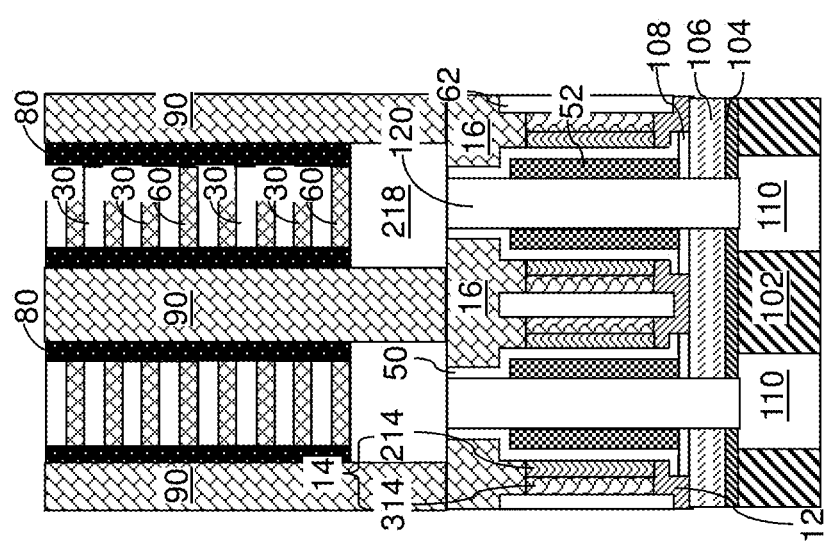
FIG. 18 is a vertical cross-sectional view of the exemplary structure after formation of a plurality of alternating stacks of insulating strips and electrically conductive word line strips over the two-dimensional array of vertical field effect transistors, resistive memory elements, and vertical bit lines according to an embodiment of the present disclosure.

Referring to FIG. 18, a three-dimensional memory array can be formed on the exemplary structures. For example, an insulating spacer layer 218 (e.g., silicon nitride) can be formed on any of the first, second, and third exemplary structures. A plurality of alternating stacks (30, 60) of insulating strips 60 and electrically conductive word line strips 30 can be formed over the two-dimensional array of vertical field effect transistors of the exemplary structures described above. Each layer within an alternating stack (30, 60), i.e., each of the insulating strips 60 and the electrically conductive word line strips 30 in the alternating stack (30, 60), can laterally extend along a horizontal direction, which may be selected from the first horizontal direction hd1 and the second horizontal direction hd2. Each neighboring pair of alternating stacks (30, 60) can be laterally spaced from each other by a line trench. The line trenches can form a one-dimensional array that is repeated along a horizontal direction that is perpendicular to the horizontal direction along which the layers within each alternating stack (30, 60) laterally extend. The line trenches can be filled with a two-dimensional array of dielectric pillar structures that defines a two-dimensional array of pillar cavities (i.e., cavities having a respective pillar shape). Each pillar cavity is laterally bounded by a neighboring pair of alternating stacks (30, 60) along one horizontal direction, and is laterally bounded by a neighboring pair of dielectric pillar structures along another horizontal direction.

Resistive memory elements 80 can be formed on the sidewalls of the pillar cavities, i.e., on the sidewalls of the plurality of alternating stacks (30, 60). The resistive memory element 80 material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

Each BMC can include a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0\times10^{20}/cm^3$ to $1.0\times10^{21}/cm^3$. The memory cell may also include a barrier material, such as amorphous silicon or other suitable barrier materials. An interfacial barrier oxide is located between the metal oxide material and the barrier material. For an amorphous silicon barrier material, the interfacial barrier oxide may comprise silicon oxide.

Without wishing to be bound by a particular theory, it is believed that the BMC ReRAM device operates as follows. The switching mechanism in BMC stack is generally understood as oxygen interstitial (Oi) generation in the interfacial barrier oxide (e.g., $SiO_2$) at the amorphous silicon (a-Si)/$TiO_{2-\delta}$ interface after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface. This re-oxidation decreases the conductivity of the $TiO_{2-\delta}$ material and/or increases the thickness of the insulating interfacial barrier oxide and hence increases the resistance of the BMC memory cell. During the SET operation, opposite voltage is applied across the cell, and Ti—O bonds are supposed to be broken down to generate Oi and $V_O$ (oxygen vacancy) pair in the titanium oxide layer. Oi may drift back to the a-Si /$TiO_{2-\delta}$ interface along the electric field to increase the conductivity of the $TiO_{2-\delta}$ layer and/or decrease the thickness of the insulating interfacial barrier oxide and hence decrease the resistance of the BMC memory cell to set the memory cell into the low resistivity state, LRS.

Without wishing to be bound by a particular theory, it is believed that a BMC ReRAM device may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide.

Optionally, the resistive memory element 80 may also include an optional steering element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction).

Vertical bit lines 90 can be formed in remaining volumes of the pillar cavities. Each vertical bit line 90 can electrically contact a respective one of the top active regions 16, and can be formed between a respective neighboring pair of alternating stacks (30, 60) among the plurality of alternating stacks (30, 60). In one embodiment, the structure formed above the two-dimensional array of vertical field effect transistors can include a three-dimensional array of resistive random access memory (ReRAM) devices.

Generally, resistive memory elements of a resistive random access memory device can be formed on sidewalls of the plurality of alternating stacks (30, 60). Vertical local bit lines 90 contacting a respective one of the top active regions 16 can be formed between a respective neighboring pair of alternating stacks (30, 60) among the plurality of alternating stacks (30, 60).

Referring generally to all of the figures of the present disclosure, a semiconductor structure comprising a two-dimensional array of vertical field effect transistors is provided. The two-dimensional array of vertical field effect transistors comprises: a one-dimensional array of gate electrode rail pairs 152, wherein each of the gate electrode rail pairs 152 comprises a pair of gate electrode rails 152 that laterally extend along a first horizontal direction hd1 and spaced among one another along a second horizontal direction hd2; a two-dimensional array of tubular gate electrode portions 52, wherein each of the tubular gate electrode portions 52 includes a pair of outer sidewalls 521 that contact sidewalls of a respective pair of gate electrode rails 152; a gate dielectric 50 located inside each of the tubular gate electrode portions 52; and a vertical semiconductor channel 14 extending along a vertical direction and located inside each of the tubular gate electrode portions 52 and laterally surrounded by the gate dielectric 50.

In one embodiment, the semiconductor structure further comprises gate divider rail structures 132 that laterally extend along the first horizontal direction hd1 and laterally separating the gate electrode rail pairs 152 among one another. In one embodiment, each of the tubular gate electrode portions 52 has a uniform lateral thickness. In one embodiment, each of the tubular gate electrode portions 52 has a rectangular outer periphery and a rectangular inner periphery. The minimum distance between the rectangular outer periphery and the rectangular inner periphery is equal to the uniform lateral thickness.

In one embodiment, each of the tubular gate electrode portions 52 comprises: first outer sidewalls 521 that laterally extend along the first horizontal direction hd1 and contact gate electrode rails 152 within a respective gate electrode rail pair 152; and second outer sidewalls 522 that laterally extend along the second horizontal direction hd2 and contact a respective dielectric separator pillar 120.

In one embodiment, the gate electrode rail pairs 152 and the tubular gate electrode portions 52 have different heights. In one embodiment, the gate electrode rail pairs 152 and the tubular gate electrode portions 52 have different compositions.

In one embodiment, the semiconductor structure can further comprise: top active regions 16 located at an upper end of a respective one of the vertical semiconductor channels 14; and bottom active regions 12 located at a lower end of a respective one of the vertical semiconductor channels 14. In one embodiment, the semiconductor structure can further comprise doped semiconductor portions 106 having a doping of the same conductivity type as the bottom active regions 12 (i.e., having a doping of the first conductivity type), contacting a respective one of the bottom active regions 12, and arranged as a two-dimensional array.

In one embodiment, each of the bottom active regions 12 can comprise: an upper portion overlying a horizontal portion of a respective one of the gate dielectrics 50 (i.e., the horizontal "foot" portion of an L-shaped gate dielectric 50); and a lower portion contacting sidewalls of the horizontal portion of the respective one of the gate dielectrics 50 and having a lesser area than the upper portion.

In one embodiment, the semiconductor structure can further comprise an alternating sequence of global bit line conductive rails 102 and dielectric separator rails 110 that alternate along the second horizontal direction hd2, wherein each of the global bit line conductive rails 102 is electrically connected to a respective column of bottom active regions 12 that are arranged along the second horizontal direction hd2.

In one embodiment, the semiconductor structure further comprises a resistive random access memory (ReRAM) device located over the two-dimensional array of vertical field effect transistors. The ReRAM device comprises: a plurality of alternating stacks of insulating strips 60 and electrically conductive word line strips 30 overlying the two-dimensional array of vertical field effect transistors; vertical local bit lines 90 electrically contacting a respective one of the top active regions 16 and vertically extending between a respective neighboring pair of alternating stacks among the plurality of alternating stacks; and resistive memory elements 80 located at each intersection between the vertical local bit lines 90 and the plurality of alternating stacks (30, 60).

The vertical semiconductor channels 14 of the vertical field effect transistors can be located entirely within a respective one of the rectangular tubular gate electrode portions 52. As such, each vertical field effect transistor includes a respective surround gate providing increased channel width and on current as well as enhanced control of channel mobility compared to vertical field effect transistors including only a pair of gate electrodes on respective two sidewalls of a rectangular semiconductor channel. Further, the vertical field effect transistors including the surrounding gates can provide enhanced sub-threshold voltage characteristics, thereby improving many device characteristics for a three-dimensional memory device. Still further, by forming the semiconductor channel 14 inside the tubular gate electrode portions 52 provides a thin polysilicon channel with small grain size for an improved device on current.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a two-dimensional array of vertical field effect transistors, wherein the two-dimensional array of vertical field effect transistors comprises:
   a one-dimensional array of gate electrode rail pairs, wherein each of the gate electrode rail pairs comprises a pair of gate electrode rails that laterally extend along a first horizontal direction and spaced among one another along a second horizontal direction;
   a two-dimensional array of tubular gate electrode portions, wherein each of the tubular gate electrode portions includes a pair of outer sidewalls that contact sidewalls of a respective pair of gate electrode rails;
   a gate dielectric located inside each of the tubular gate electrode portions; and
   a vertical semiconductor channel extending along a vertical direction and located inside each of the tubular gate electrode portions and laterally surrounded by the gate dielectric.

2. The semiconductor structure of claim 1, further comprising gate divider rail structures that laterally extend along the first horizontal direction and laterally separating the gate electrode rail pairs among one another.

3. The semiconductor structure of claim 1, wherein each of the tubular gate electrode portions has a uniform lateral thickness.

4. The semiconductor structure of claim 1, wherein each of the tubular gate electrode portions has a rectangular outer periphery and a rectangular inner periphery.

5. The semiconductor structure of claim 1, wherein each of the tubular gate electrode portions comprises:
   first outer sidewalls that laterally extend along the first horizontal direction and contact gate electrode rails within a respective gate electrode rail pair; and
   second outer sidewalls that laterally extend along the second horizontal direction and contact a respective dielectric separator pillar.

6. The semiconductor structure of claim 1, wherein the gate electrode rail pairs and the tubular gate electrode portions have different heights.

7. The semiconductor structure of claim 1, wherein the gate electrode rail pairs and the tubular gate electrode portions have different compositions.

8. The semiconductor structure of claim 1, further comprising:
    top active regions located at an upper end of a respective one of the vertical semiconductor channels; and
    bottom active regions located at a lower end of a respective one of the vertical semiconductor channels.

9. The semiconductor structure of claim 8, further comprising doped semiconductor portions having a doping of a same conductivity type as the bottom active regions, contacting a respective one of the bottom active regions, and arranged as a two-dimensional array.

10. The semiconductor structure of claim 8, wherein each of the bottom active regions comprises:
    an upper portion overlying a horizontal portion of a respective one of the gate dielectrics; and
    a lower portion contacting sidewalls of the horizontal portion of the respective one of the gate dielectrics and having a lesser area than the upper portion.

11. The semiconductor structure of claim 8, further comprising an alternating sequence of global bit line conductive rails and dielectric separator rails that alternate along the second horizontal direction, wherein each of the conductive rails is electrically connected to a respective column of bottom active regions that are arranged along the second horizontal direction.

12. The semiconductor structure of claim 11, further comprising a resistive random access memory (ReRAM) device located over the two dimensional array of vertical field effect transistors, the ReRAM device comprising:
    a plurality of alternating stacks of insulating strips and electrically conductive word line strips overlying the two-dimensional array of vertical field effect transistors;
    vertical local bit lines electrically contacting a respective one of the top active regions and vertically extending between a respective neighboring pair of alternating stacks among the plurality of alternating stacks; and
    resistive memory elements located at each intersection between the vertical local bit lines and the plurality of alternating stacks.

13. A method of forming a semiconductor structure, comprising:
    sequentially forming a stack of a doped semiconductor material layer, a planar insulating spacer layer, and a sacrificial matrix layer;
    laterally dividing the stack along a first horizontal direction by forming dielectric wall structures extending along a second horizontal direction;
    forming gate trenches through the dielectric wall structures and remaining portions of the stack, wherein each of the gate trenches laterally extends along the first horizontal direction;
    forming gate electrode rails on sidewalls of remaining portions of the sacrificial matrix layer in the gate trenches;
    forming a two-dimensional array of rectangular openings by removing remaining portions of the sacrificial matrix layer;
    forming a two-dimensional array of tubular gate electrode portions in the two-dimensional array of rectangular openings;
    forming gate dielectrics on sidewalls of the tubular gate electrode portions; and
    forming vertical semiconductor channels within each of the gate dielectrics by deposition of a semiconductor material.

14. The method of claim 13, wherein each of the tubular gate electrode portions includes a pair of first outer sidewalls that contact sidewalls of a respective pair of gate electrode rails and a pair of second outer sidewalls that contact remaining portions of the dielectric wall structures.

15. The method of claim 13, wherein the gate electrode rails are formed by:
    depositing a gate rail material layer in the gate trenches; and
    anisotropic ally etching the gate rail material layer, wherein remaining portions of the gate rail material layer constitute the gate electrode rails.

16. The method of claim 13, further comprising:
    forming gate divider rail structures by filling the gate trenches with a dielectric material after formation of the gate electrode rails; and
    performing a selective etch process that removes the remaining portions of the sacrificial matrix layer selective to materials of the gate divider rail structures and the dielectric wall structures, whereby the two-dimensional array of rectangular openings is formed.

17. The method of claim 13, further comprising:
    depositing a gate electrode material layer in the two-dimensional array of rectangular openings; and
    anisotropically etching the gate electrode material layer, wherein remaining vertical portions of the gate electrode material layer comprise the two-dimensional array of tubular gate electrode portions.

18. The method of claim 13, wherein:
    the doped semiconductor material layer has a doping of a first conductivity type; and
    the vertical semiconductor channels are intrinsic or have a doping of a second conductivity type that is an opposite of the first conductivity type.

19. The method of claim 18, further comprising:
    forming top active regions having a doping the first conductivity type over the vertical semiconductor channels; and
    forming bottom active regions by diffusing dopants of the first conductivity type from the doped semiconductor material layer into lower portions of the vertical semiconductor channels.

20. The method of claim 13, further comprising:
    forming an alternating sequence of global bit line conductive rails and dielectric separator rails that alternate along the second horizontal direction over the substrate, wherein each of the dielectric wall structures is formed on a top surface of a respective one of the dielectric separator rails, and each of the global bit line conductive rails contacts a respective remaining portion of the doped semiconductor material layer after formation of the dielectric wall structures;
    forming a plurality of alternating stacks of insulating strips and electrically conductive word line strips overlying the two-dimensional array of vertical field effect transistors;
    forming resistive memory elements of a resistive random access memory device on sidewalls of the plurality of alternating stacks; and
    forming vertical local bit lines contacting a respective one of the top active regions between a respective neighboring pair of alternating stacks among the plurality of alternating stacks.

* * * * *